(12) United States Patent
Wu et al.

(10) Patent No.: US 12,437,975 B2
(45) Date of Patent: Oct. 7, 2025

(54) APPARATUS AND METHOD OF MANUFACTURING A SEMICONDUCTOR DEVICE

(71) Applicant: Taiwan Semiconductor Manufacturing Company, Ltd., Hsinchu (TW)

(72) Inventors: Tsung-Cheng Wu, Hsinchu (TW); Ming-Hsien Lin, Taichung (TW); Chun-Fu Chen, Hsinchu (TW); Sheng-Ying Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/420,184

(22) Filed: Jan. 23, 2024

(65) Prior Publication Data

US 2024/0242942 A1 Jul. 18, 2024

Related U.S. Application Data

(62) Division of application No. 17/141,751, filed on Jan. 5, 2021, now Pat. No. 11,935,728.

(60) Provisional application No. 62/968,613, filed on Jan. 31, 2020.

(51) Int. Cl.
*H01J 37/32* (2006.01)
*H01L 21/3205* (2006.01)
*H01L 21/3213* (2006.01)
*H01L 21/67* (2006.01)

(52) U.S. Cl.
CPC .. *H01J 37/32651* (2013.01); *H01L 21/32051* (2013.01); *H01L 21/32131* (2013.01); *H01L 21/67259* (2013.01)

(58) Field of Classification Search
CPC ............ H01J 37/32651; H01J 37/3299; H01L 21/32051; H01L 21/32131; H01L 21/67259; H01L 21/3065; H01L 21/68735; H01L 21/67011; H01L 21/67069; C23C 14/0641; C23C 14/14; C23C 14/34; C23C 14/54
See application file for complete search history.

(56) References Cited

U.S. PATENT DOCUMENTS 6,976,903 B1 * 12/2005 Williams ................ B24B 41/04
451/63
9,478,455 B1 * 10/2016 Ouye ................ H01J 37/32642
10,099,245 B2 * 10/2018 Forster ................ H01J 37/3408
(Continued)

FOREIGN PATENT DOCUMENTS

CN 102945788 A * 2/2013 ........ H01J 37/32642
CN 110036136 A * 7/2019 ........... C23C 14/042
(Continued)

*Primary Examiner* — Mohammed Shamsuzzaman
(74) *Attorney, Agent, or Firm* — STUDEBAKER BRACKETT PLLC

(57) ABSTRACT

To reduce the occurrence of current alarms in a semiconductor etching or deposition process, a controller determines an offset in relative positions of a cover ring and a shield over a wafer within a vacuum chamber. The controller provides a position alarm and/or adjusts the position of the cover ring or shield when the offset is greater than a predetermined value or outside a range of acceptable values.

20 Claims, 15 Drawing Sheets

(56) References Cited

U.S. PATENT DOCUMENTS

| | | | |
|---|---|---|---|
| 2008/0257263 A1* | 10/2008 | Pavloff | H01J 37/3441 |
| | | | 118/723 R |
| 2009/0251699 A1* | 10/2009 | George | H01L 23/544 |
| | | | 356/399 |
| 2010/0024723 A1* | 2/2010 | Hasegawa | H01L 21/68 |
| | | | 118/500 |
| 2011/0036709 A1* | 2/2011 | Hawrylchak | C23C 14/564 |
| | | | 204/298.11 |
| 2016/0336149 A1* | 11/2016 | Larsson | H01J 37/32467 |
| 2017/0002461 A1* | 1/2017 | Johanson | C23C 14/3407 |
| 2020/0090972 A1* | 3/2020 | Benjaminson | H01J 37/32724 |
| 2020/0393242 A1* | 12/2020 | Vishwanath | H01J 21/68742 |
| 2021/0238741 A1* | 8/2021 | Wu | H01J 37/32449 |
| 2021/0292888 A1* | 9/2021 | Lavitsky | C23C 14/564 |
| 2022/0157635 A1* | 5/2022 | Chowdhury | H01L 21/02656 |

FOREIGN PATENT DOCUMENTS

| | | | | |
|---|---|---|---|---|
| CN | 110062954 A | * | 7/2019 | C23C 16/4584 |
| CN | 209747490 U | * | 12/2019 | H01J 37/32642 |
| JP | 3222783 U | * | 8/2019 | H01J 37/32642 |
| TW | 202117785 A | * | 5/2021 | H01J 37/32642 |
| TW | 202137822 A | * | 10/2021 | H01J 37/32642 |
| WO | WO-0224410 A1 | * | 3/2002 | B24B 37/04 |
| WO | WO-2012019335 A1 | * | 2/2012 | B24B 37/345 |
| WO | WO-2020231611 A1 | * | 11/2020 | H01J 37/20 |
| WO | WO-2021026110 A1 | * | 2/2021 | H01J 37/32642 |
| WO | WO-2021080706 A1 | * | 4/2021 | H01L 21/67265 |

\* cited by examiner

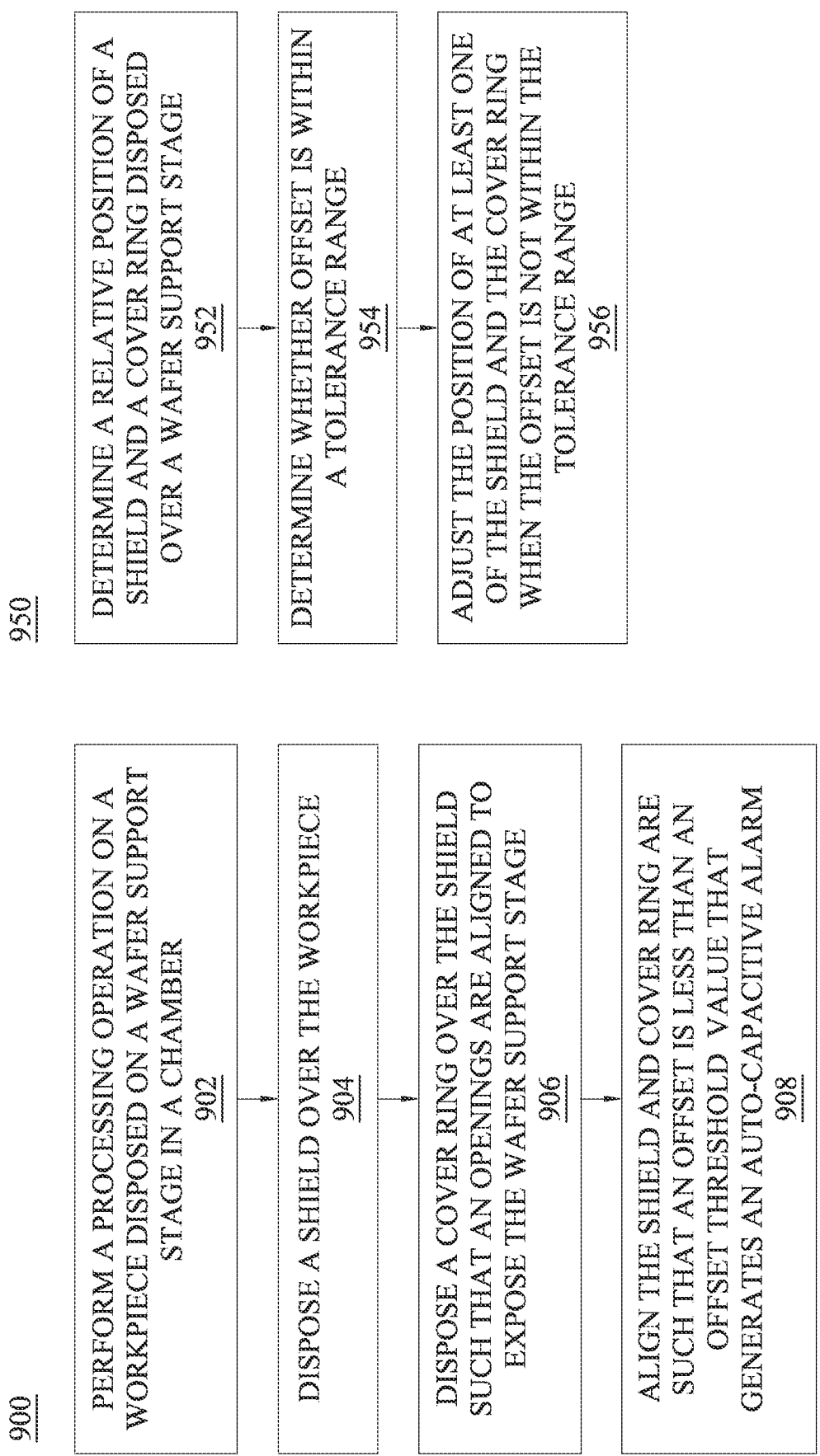

APPARATUS AND METHOD OF MANUFACTURING A SEMICONDUCTOR DEVICE

CROSS-REFERENCE TO RELATED APPLICATION

This application is a divisional application of U.S. patent application Ser. No. 17/141,751, Jan. 5, 2021, now U.S. Pat. No. 11,935,728, which claims priority under 35 U.S.C. § 119(e) to U.S. Provisional Patent Application Ser. No. 62/968,613, filed Jan. 31, 2020, the entire disclosures of each of which is incorporated herein by reference.

BACKGROUND

Some semiconductor device processing operations, such as etching and material deposition, are performed in a vacuum chamber. Various such processes performed in the vacuum chamber employ an auto capacitive tuner (ACT) component to modify the ion energy in order to, for example, control the stress of a deposited film. Such processes occasionally suffer from a range ACT current alarm, which is monitored by a fault detection control (FDC). This may happen randomly or when the impedance of the chamber is not uniform due to various errors. Any unstable or non-uniform impedance of the vacuum chamber may, in turn, undesirably cause abnormal properties of the deposited or etched film.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 and FIG. 17 are flowcharts depicting exemplary processes according to the disclosure.

DETAILED DESCRIPTION

Figure 1:
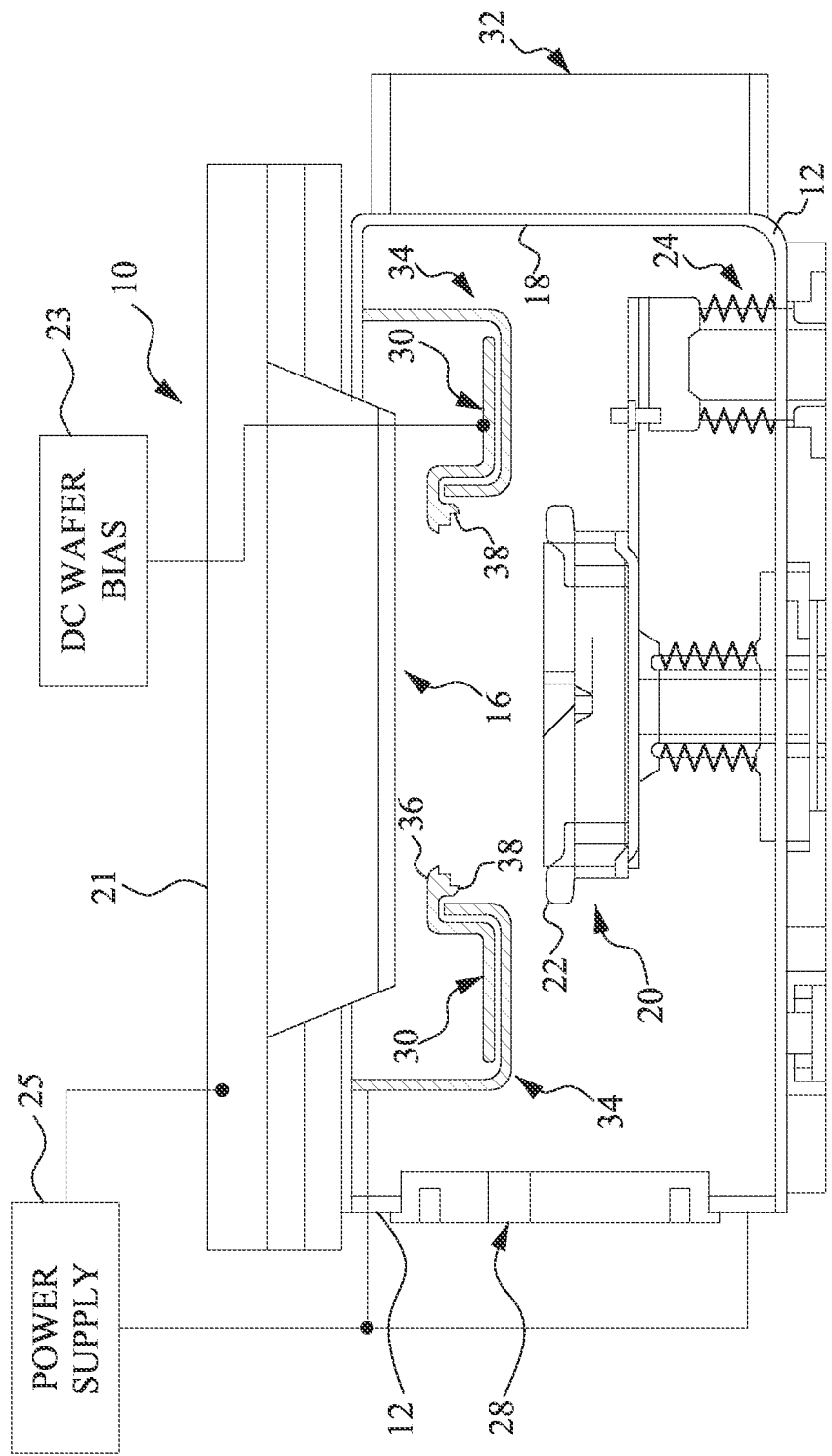
FIGS. 1 and 2 show a manufacturing apparatus according to embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include embodiments in which the first and second features are formed in direct contact, and also include embodiments in which additional features are formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Physical vapor deposition (PVD), or sputter deposition, is a frequently-used processing technique in the manufacturing of semiconductor devices, such as processors or controller chips. It involves the deposition of a metallic layer on the surface of a workpiece, such as a wafer, which is then sequentially transformed into a semiconductor device. PVD techniques are also referred to as sputtering techniques. In some embodiments, the sputtering technique is used to deposit metallic layers from a source material, such as tungsten (W), tungsten nitride (WN), titanium (Ti), and titanium nitride (TiN).

In a sputtering process, inert gas particles, such as those of helium, argon or nitrogen, are first ionized in an electric field to produce a gas plasma within a sputter chamber. The plasma is then attracted toward a source or a target where the energy of the gas particles physically dislodge (i.e., sputters off) atoms of the metallic or other source material. The sputtering technique is very versatile in that various materials are deposited utilizing not only radio frequency (RF) but also direct current (DC) power sources.

In some embodiments, the sputter chamber includes a stainless steel chamber that is vacuum-tight and equipped with a gas leak detector; a vacuum pump that has the capacity to reduce the chamber pressure to at least 10-6 torr or lower; various pressure gauges; a sputter source or target; an RF or DC power supply; a wafer support stage; a chamber shield; and a clamp ring or cover ring. The sputter source is mounted on the roof of the chamber in some embodiments such that it faces the wafer support stage, which is positioned in the center of the chamber. The sputter source comprises a Ti, W, TiW, nickel (Ni), tantalum (Ta), or tin (Sn) disc for a process in which such metal layers are sputtered. In some embodiments, the sputtering process is formed in a nitrogen ambient to form a metal nitride layer. In some embodiments, the wafer support stage includes a pedestal having an internal resistive heater.

In some embodiments, the clamp ring serves two purposes during a sputter process. The first purpose is to clamp the wafer to the pedestal heater. The clamp ring holds the wafer in place on the pedestal when a positive gas pressure is applied between the heater and the pedestal such that heat is efficiently conducted from the heater to the wafer. The second purpose served by the clamp ring is to allow a flow of gas, including argon or nitrogen to flow from under the wafer into the sputter chamber. The clamp ring is constructed in a circular shape with an oriented cut-out to match a wafer's flat contour in some embodiments. A hood is built into the clamp ring and is used for shadowing purposes to protect the lip of the clamp ring from being coated by the sputtered metal particles. The lip portion also allows the force of the clamp ring to be evenly distributed around the wafer.

A cross-sectional view of an exemplary sputter chamber 10 is shown in FIG. 1. The sputter chamber 10, in some embodiments, is constructed of: a stainless steel chamber body 12 that is vacuum-tight; a sputter target 16 of Ti, W, TiW, Ta, Ni, or Sn; a wafer support stage 20 (or pedestal) equipped with a heater 22; a wafer lift mechanism 24; a wafer port 28; a pumping port 32; a clamp ring 30; and a chamber shield 34. A DC or RF power supply 25 is connected to the sputter target 16 via an electrode 21 and a conductive part of the sputter chamber 10, such as the chamber wall 18 or chamber shield 34, thereby establishing a voltage potential between the grounded chamber wall 18 and the target 16 in various embodiments. In various embodiments, a DC wafer bias circuit 23 is connected to the clamp ring 30 and thus applies a DC bias to the wafer (not shown).

As shown in FIG. 1, the chamber shield 34 is a component disposed within the sputter chamber 10. It forms a seal between the clamp ring 30 and the chamber body 12 such that sputtered particles from the sputter target 16 do not contaminate the chamber wall 18 during the sputtering process. A hood 36 of the clamp ring 30 protects a tip portion 38 of the clamp ring 30 from being coated by the sputtered particles. It should be noted that, during the sputtering process, the wafer support stage 20 is in a raised position with the tip portion 38 of the clamp ring 30 touching the heater 22 on the wafer support stage 20. In order to achieve a tight seal from the chamber wall 18, a small gap is maintained between the clamp ring 30 and the chamber shield 34.

In some metal sputtering processes where a Ti, W, TiW, Sn, Ta, Ni, or other metal target is used in the sputter chamber 10, the emission of sputtered particles of the metals is shaped with a forward cosine distribution so that a more desirable deposition is achieved, in which metal particles are deposited uniformly at the center and the edge of the wafer.

Figure 2:
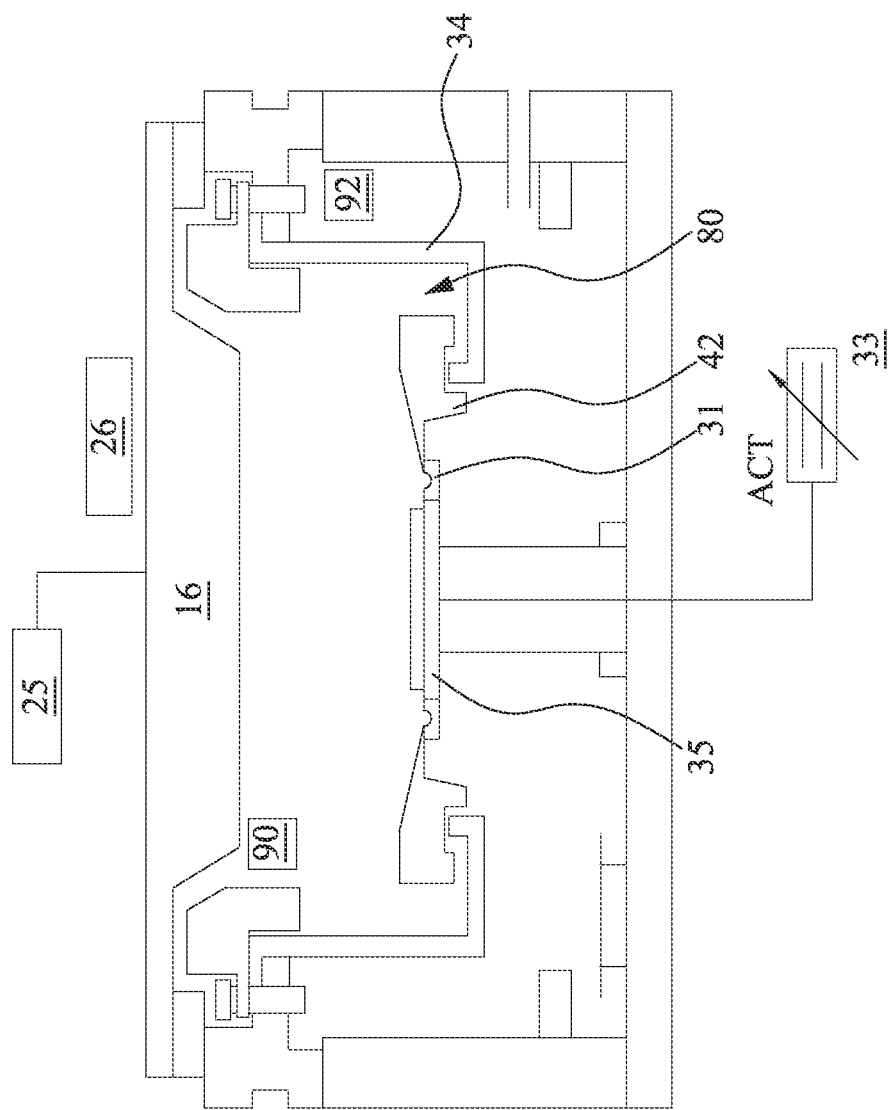
Figure 4:
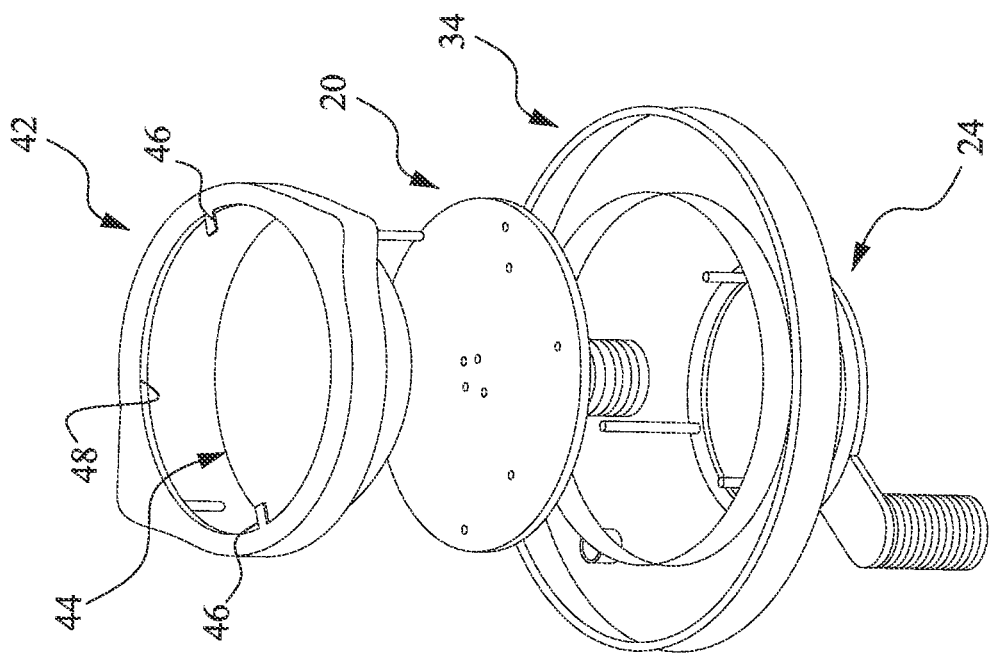
FIGS. 3, 4, and 5 show perspective and side views of shield and cover ring arrangements according to the disclosure.
Figure 3:
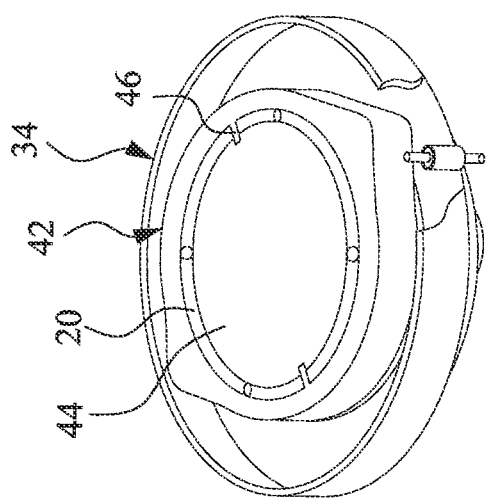
Figure 5:
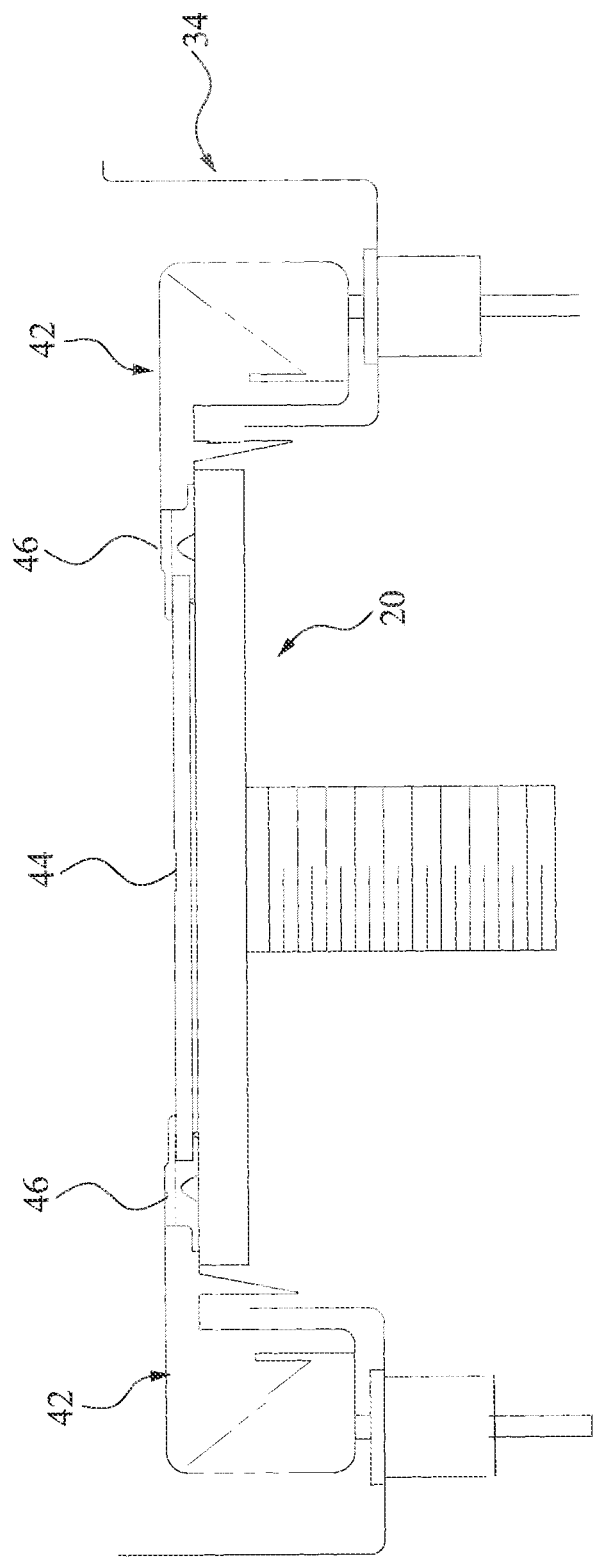

In some embodiments, instead of the clamp ring 30 shown in FIG. 1, a cover ring 42 is used, as shown in FIG. 2 and described in more detail in FIGS. 3-5. Unlike the clamp ring 30, the cover ring 42 shown in FIG. 2 does not clamp onto the surface of wafer 44. In other embodiments, the chamber 10 includes a magnetic device 26, such as a magnetron, for applying a magnetic field to the surface of target 16. The magnetic field generated by the magnetic device 26 confines electrons near the target 16 in order to sustain a plasma that is generated inside the chamber 10 during the sputtering process.

In various embodiments, the chamber 10 includes a deposition ring 31, an auto-capacitive tuner (ACT) 33, and an electrostatic chuck (ESC) 35 having a heater. The deposition ring 31, in cooperation with the cover ring 42, reduces formation of sputter deposits on the peripheral edges of the wafer. The deposition ring 31 is fabricated from a ceramic or metal material, such as quartz, aluminum oxide, stainless steel, titanium or other suitable material. The ESC 35 is used to support and retain wafers within the chamber 10 during processing. The ESC 35 includes a ceramic puck having one or more electrodes therein. A chucking voltage is applied to the electrodes and the heater to electrostatically hold the wafer to the ESC 35. The ACT 33 controls electrical current in order to maintain a chamber impedance, which in turn, serves to control film properties of the wafer. If the chamber impedance becomes uncontrolled, this will cause the output current of the ACT 33 to become unstable resulting in an ACT current alarm from an FDC that monitors the sputtering process.

In various embodiments, the chamber 10 also has disposed therein one or more position sensors 90 that determine a relative position of the shield 34, cover ring 42 and wafer support stage 20, and to determine any offset in the positions thereof. In various embodiments, a position adjustment device 92 or mechanism is disposed in the chamber 10 to change the position of one or more of the shield 34, the cover ring 42, the deposition ring 31 or the wafer support stage 20 so that any measured offsets there-between that are greater than a threshold value or outside a range as proscribed herein are corrected.

As semiconductor devices become smaller, it becomes difficult to achieve critical dimensions for vias and trenches. Metals such as tantalum (Ta) and titanium (Ti), and metal compounds such as tantalum nitride (TaN) and titanium nitride (TiN), provide critical dimensions for integrated circuit (IC) fabricators to form small vias and trenches. Metals and metal compounds are also used as antireflective coatings and/or barrier layers in many processes for forming trenches and vias. In a metal hard mask (MHM) process using TiN deposition for trench/via etching of low-k/dielectric materials, such processes randomly suffer FDC Range ACT current alarms. This, in turn, will cause film properties and thickness of the processed wafer to become abnormal. It has been discovered that in many instances when the chamber 10 suffers such alarm, the cover ring 42 and the shield 34 are offset and not properly aligned. For example, in processes where the gap between the deposition ring 31 or cover ring 42 and the shield 34 is in the range of about 2.1 to about 2.5 millimeters (mm), an ACT alarm occurs when the offset of the cover ring 42 and the shield 34 is greater than 0.3 mm in one or more directions. Accordingly, it is necessary to fine tune the centering of the ESC 35 with the shield 34 such that the range of the offset of the cover ring 42 to the shield 34 is maintained between 0 mm and about 0.3 mm in order to successfully maintain the current range of the ACT to prevent a current range alarm by the FDC. In other embodiments, the sputter chamber 10 is, instead a chemical vapor deposition (CVD) apparatus, a plasma-enhanced chemical vapor deposition (PECVD) apparatus, an atmospheric pressure chemical vapor deposition (APCVD) apparatus, a low-pressure CVD (LPCVD) apparatus, a high density plasma CVD (HDPCVD) apparatus, an atomic layer deposition (ALD) apparatus, and/or other such apparatus. In such processes, the values of the size of the cover ring 42, and offset in alignment differ.

In some embodiments, the cover ring 42 is equipped with alignment mark shields 46, as shown in FIG. 3, which extend radially inwardly from an inner periphery 48 of the cover ring 42. The function of the alignment mark shield 46 is to cover the alignment marks (not shown) located on the top surface 44 of a wafer and to prevent the deposition of metal particles thereon.

Turning to FIG. 4, when the wafer lifter 24 raises up with a wafer mounted on top to meet the cover ring 42. The cover ring 42 is properly seated on the wafer pedestal 20 in order to provide proper shielding of the alignment marks. There is an opening in the cover ring 42 that is aligned with the shield 34 such that the top surface 44 of the wafer is exposed through such opening such that a sputtering process is performed on the wafer.

Useful alignment cannot be ensured when the chamber 10 has been operated after a length of time or when the chamber 10 has been cleaned during a preventive maintenance procedure. When the cover ring 42 is not properly seated, or aligned with, the wafer pedestal 20, excess metal particle deposition between the cover ring 42 and the chamber shield 34 could cause arcing between those two components during sputtering. Moreover, metal particles may further penetrate through gaps formed between the two components and deposit on the bottom of the chamber 10, which could cause a serious contamination problem therein. A mismatch in the alignment of the cover ring 42, chamber shield 34, and the ESC 35 (an example of such offset being shown in FIGS. 13A and 13B as discussed later below) is discovered to also cause range ACT current alarms.

A side view of a properly aligned cover ring 42 and shield 34 is shown in FIG. 5. In some embodiments, an apparatus for self-aligning a cover ring 42 to a wafer support stage 20 in a sputter chamber 10 is provided. The wafer support stage 20 is in the shape of a circular disk on an outer periphery thereof. The annular shaped cover ring 42 has an inwardly, horizontally extending lip, and at least one downwardly, vertically extending lip equipped on an inner periphery with at least two female alignment members adapted for receiving at least two male alignment members when the wafer support stage 20 is raised to meet the cover ring 42.

The cover ring 42 is be provided in an annular shape that has an inwardly, horizontally extending lip and at least one downwardly, vertically extending lip equipped on an inner periphery, and at least two female alignment members, such as recessed slots, adapted for receiving the at least two male alignment members on the wafer support stage 20 when the support stage is raised to engage the cover ring 42.

Figure 6:
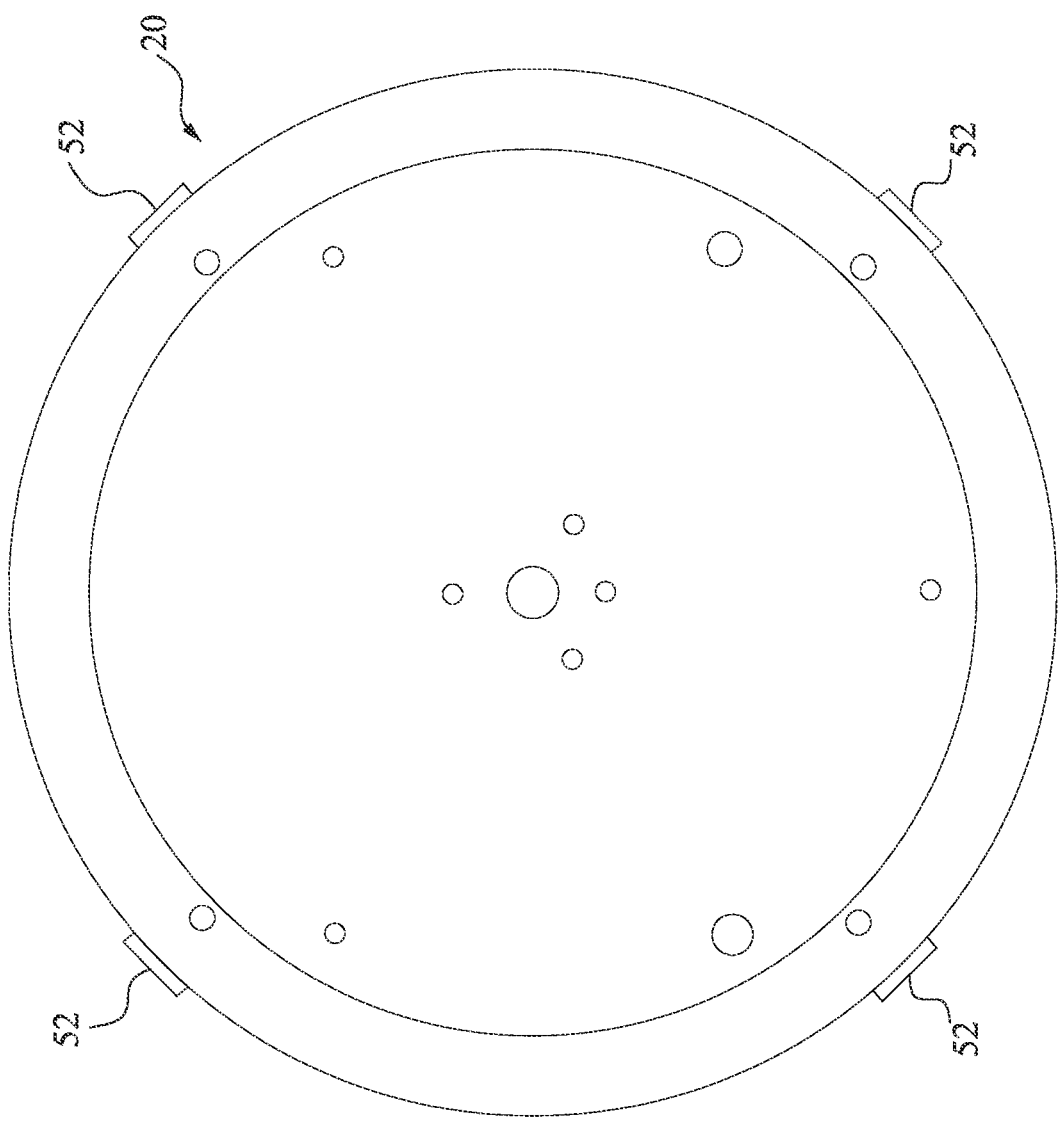
FIGS. 6, 7, and 8 show top and side views of shield and cover ring arrangements according to the disclosure.
Figure 7:
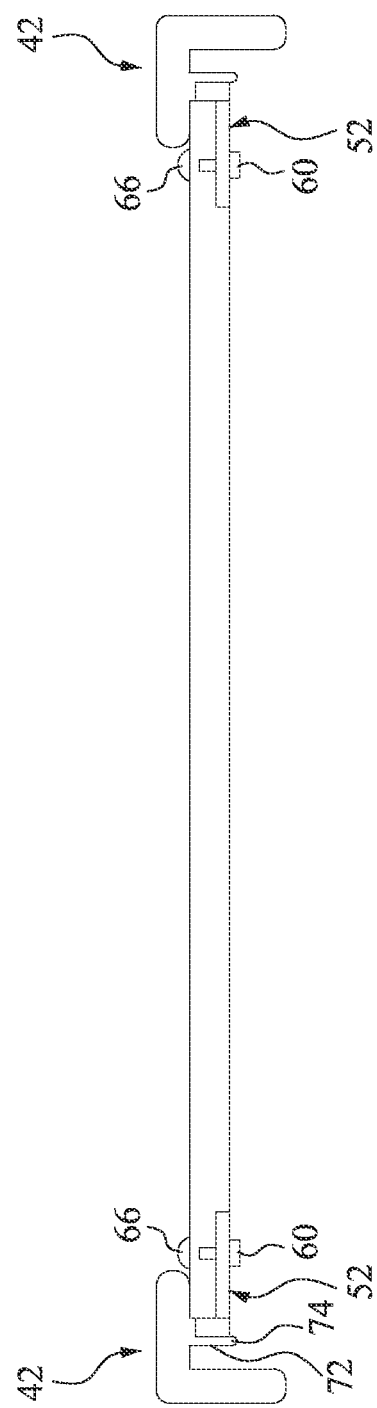
Figure 8:
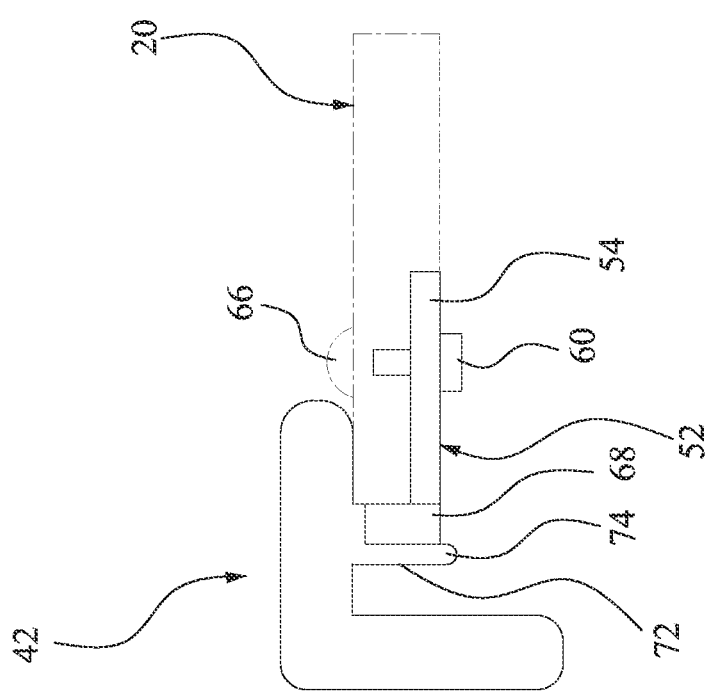

FIGS. 6-8 illustrate a top view and side views of an embodiment of the wafer support stage 20 and a wafer support stage/cover ring assembly. In some embodiments, as shown in FIG. 6, the wafer support stage 20 is provided with four male alignment members 52, which, in various embodiments, is four protruding tabs. It is seen that a protruding tab 52 is advantageously provided in an L-shape with one leg 54 of the "L" mechanically engaging a recess provided in a bottom surface of the wafer support stage 20. The L-shaped protruding tab 52 is advantageously fastened to the wafer support stage 20 by mechanical means, such as by a screw 60 through a mounting hole (not shown) in the protruding tab 52 and a mounting hole (not shown) in the wafer support stage 20. Other mounting means, such as frictional engagement or tongue-and-groove engagement is also able to be utilized. A screw 60 used to mechanically fasten the protruding tab 52 to the wafer support stage 20 is shown in the cross-sectional views of FIGS. 7 and 8. Also shown in FIG. 7, on top of the wafer support stage 20, is a wafer positioning guide 66 which is mounted on the top surface in a circular manner to locate a wafer (not shown) to be mounted thereon.

Another embodiment of the cover ring 42 is also shown in FIGS. 7 and 8. The cover ring 42, as shown in an enlarged view in FIG. 8, further includes a surface 72 in a downwardly extending lip 74. It should be noted that the surface 72 assists in guiding and receiving the upwardly standing leg 68 of the protruding tab 52 when the wafer support stage 20 is pushed up to engage the cover ring 42. The surface 72 is provided in all three surfaces of the recessed slot in the downwardly extending lip 74 of the cover ring 42. It should be noted that, in FIG. 8, only the surface 72 in one dimension is shown, while the surfaces in the other two dimensions are not shown. It should also be noted that surface 72 is a tapered surface in some embodiments.

In order to maintain stable impedance across the sputter chamber 10, it is desirable to control an alignment offset of the cover ring 42 to the chamber shield 34 to within a range of 0 to about 0.3 mm. In some embodiments, the chamber shield 34 and cover ring 42 are maintained in alignment that varies by 0.3 mm or less in radial offset. Maintaining this alignment reduces the possibility of triggering a range ACT current alarm during a wafer manufacturing process and also maintains metal film thickness and uniformity.

Figure 9:
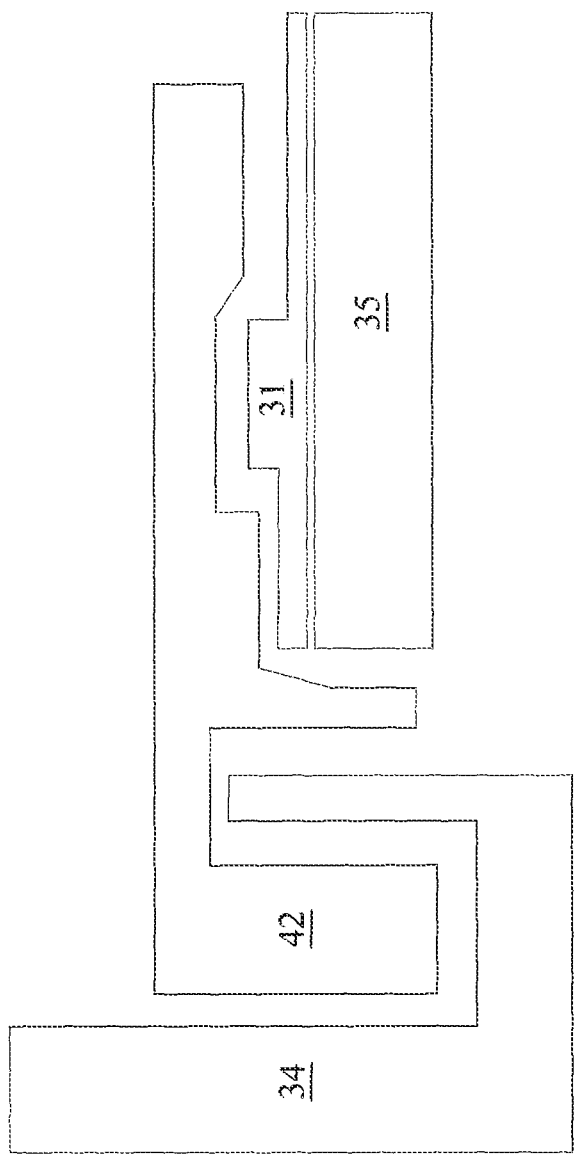
FIG. 9 shows a schematic view of an additional shield and cover ring arrangement according to the disclosure.

A detailed view of the shield/cover ring/wafer support stage arrangement according to various embodiments is shown in FIG. 9. In some embodiments, a deposition ring (dep-ring) 31 is disposed over the wafer support stage 20 and the cover ring 42 is disposed over the dep-ring 31. In some embodiments, the cover ring 42 is configured to accommodate protrusions on the dep-ring 31. The deposition ring 31 and the cover ring 42 cooperate with one another to reduce formation of sputter deposits on the peripheral edges of the wafer support stage 20 and the overhanging edge of the wafer substrate. The cover ring 42 also engages with the chamber shield 34. In some embodiments, the wafer support stage 20 includes an ESC 35. The ESC 35 is used to support and retain wafer substrates within the processing chamber 10 during processing. The ESC 35 plays an important role in the adsorbing and cooling/heating of wafers, and provides the technical advantages of non-edge exclusion, high reliability, wafer planarity, and particle reduction.

The radial offset distance of the deposition ring 31, the shield 34 and the cover ring 42 may be measured any of a variety of techniques. In various embodiments herein where the radial offset is described as being between the cover ring 42 and the shield 34, the radial offset is performed by comparing the positions of any two of the cover ring 42, the deposition ring 31 and the shield 34. For example, in various embodiments, the radial offset measured by comparing positions of the cover ring 42 and the shield 34 is substituted with a comparison of deposition ring 31 and the shield 34. In some embodiments, the radial offset is measured by comparing positions of the deposition ring 31 and the cover ring 42. In some embodiments, the radial offset distance is measured by position sensors locating an edge of the inner periphery of an opening of the cover ring 42 and an outer edge of the shield 34. In some embodiments, the radial offset distance is measured by position sensors locating an edge of the inner periphery of an opening of the shield 34 and an edge of the inner periphery of an opening of the cover ring 42. In some embodiments, the radial offset distance is measured by position sensors locating an outer edge of the cover ring 42 and an outer edge of the shield 34. In various embodiments, the radial offset distance is measured in two directions. In various embodiments, the radial offset distance is measured in two orthogonal directions.

Figure 10:
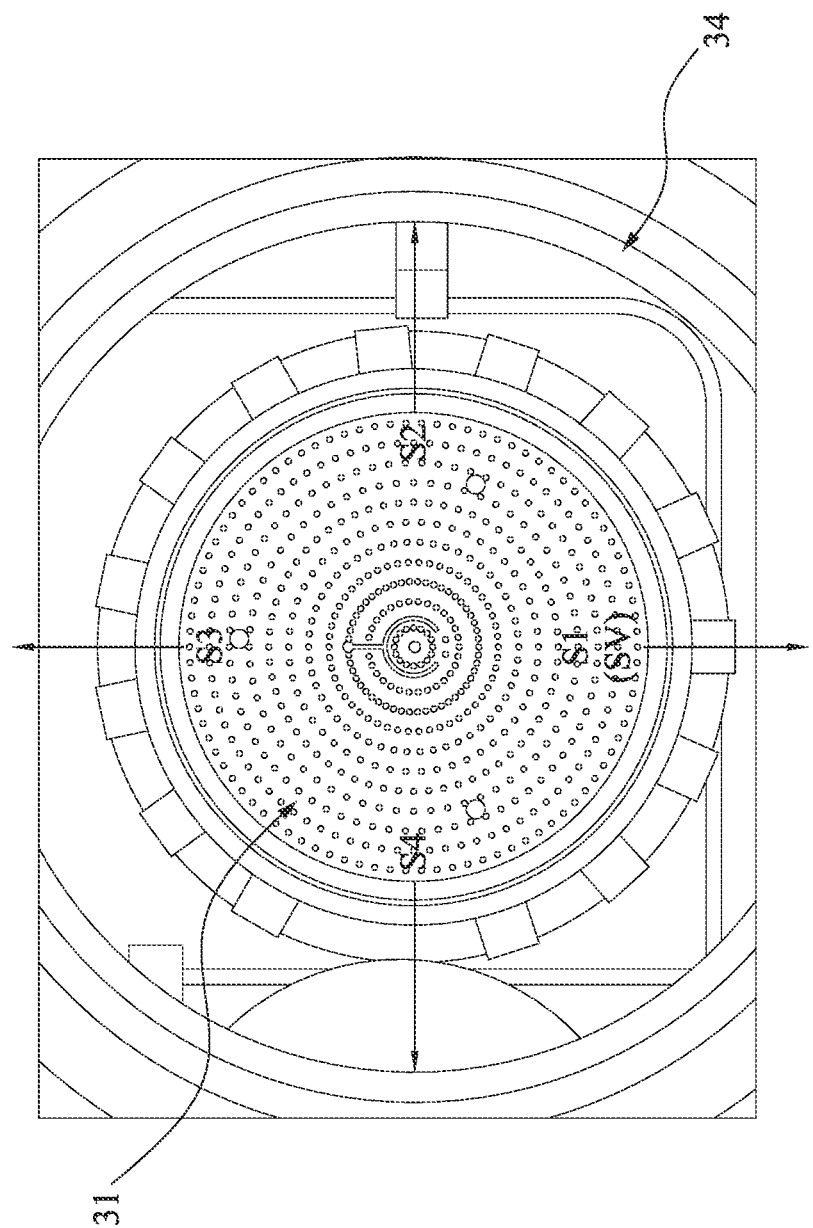
FIGS. 10, 11A, 11B, and 12 illustrates shield and cover ring arrangements according to the disclosure.

A top-down photographic view of the physical alignment of the shield 34 and deposition ring 31 is illustrated in FIG. 10. Horizontal alignment offsets S1 and S3 and vertical alignment offsets S2 and S4 are illustrated therein. The direction S1 to S3 and the direction S2 to S4 may be orthogonal to each other. In various embodiments where the gap 80 (see FIGS. 11A and 11B) between the deposition ring 31 and the shield 34 is in the range of about 2.1-2.5 mm, the absolute value of S1-S3 and the absolute value of S2-S4 should be maintained to be less than 0.3 mm. In other words, |S1-S3| and |S2-S4|<0.3 mm. In various embodiments, the extension line of S1 passes through the center of cover ring 42, the extension line of S1 is aligned with (or parallel to) the extension line of S3, and/or the extension line of S1 is substantially vertical to the extension line of S2.

Figure 11A:
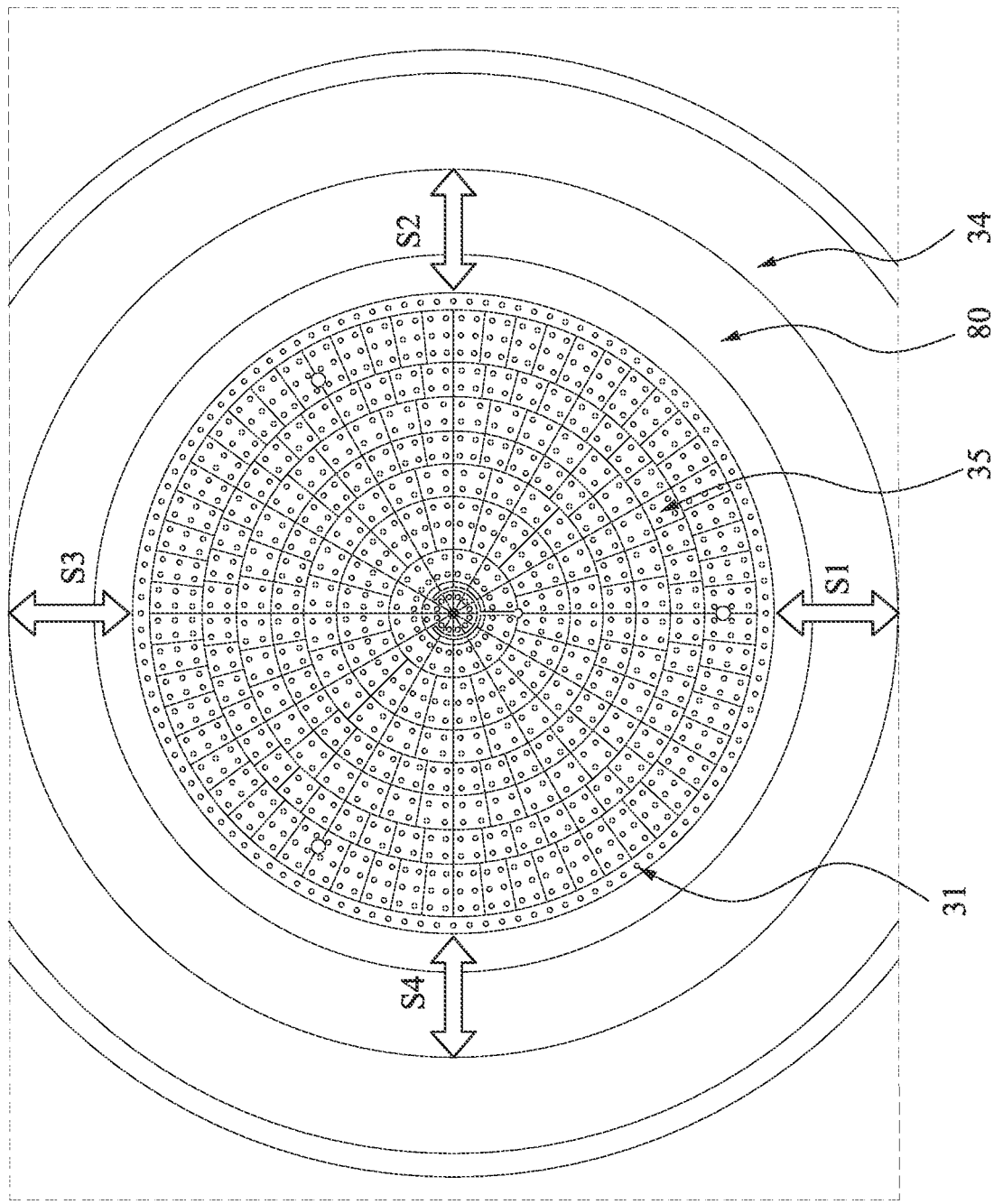
Figure 11B:
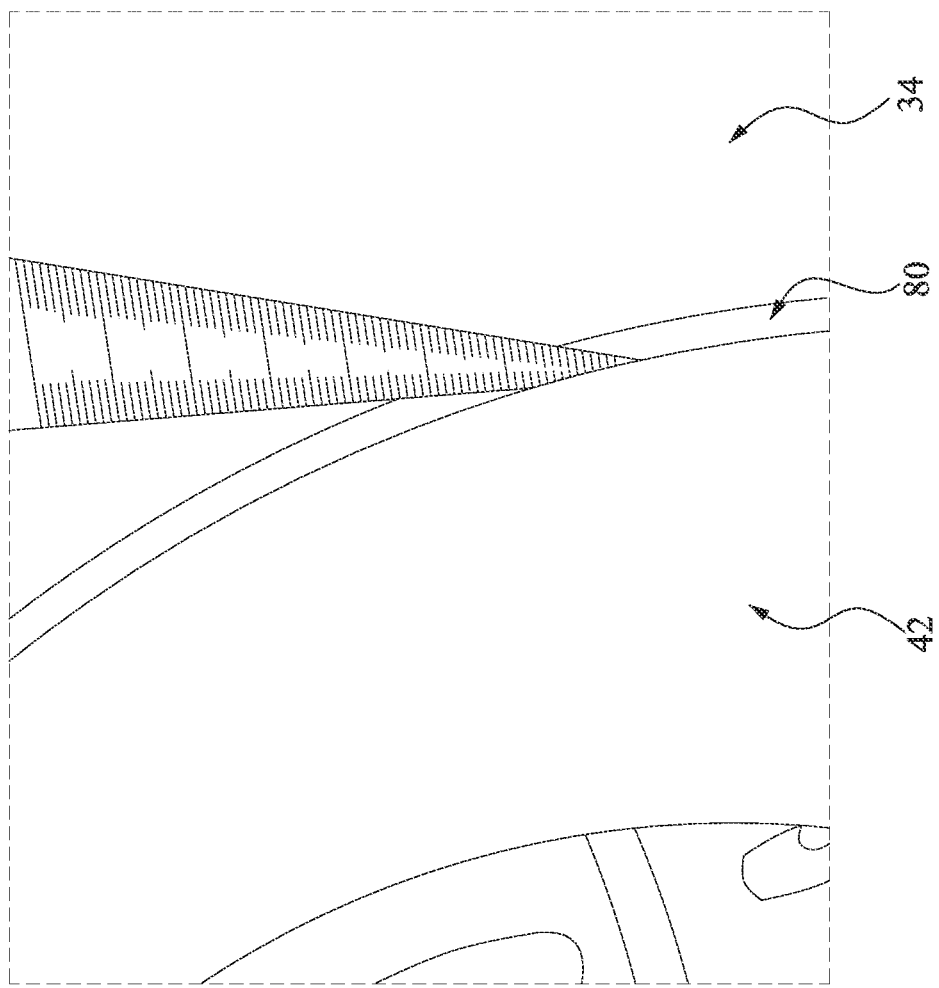

FIG. 11A shows a photographic view of the top-down alignment of the deposition ring 31 and shield 34, along with offset distances S1-S4. FIG. 11B shows a top-down photographic view of the cover ring 42 and shield 34. In various embodiments, there is a gap 80 between shield 34 and the deposition ring 31 or cover ring 42. The gap 80, in various embodiments described herein, is between about 2.1 and 2.5 millimeters.

Figure 12:
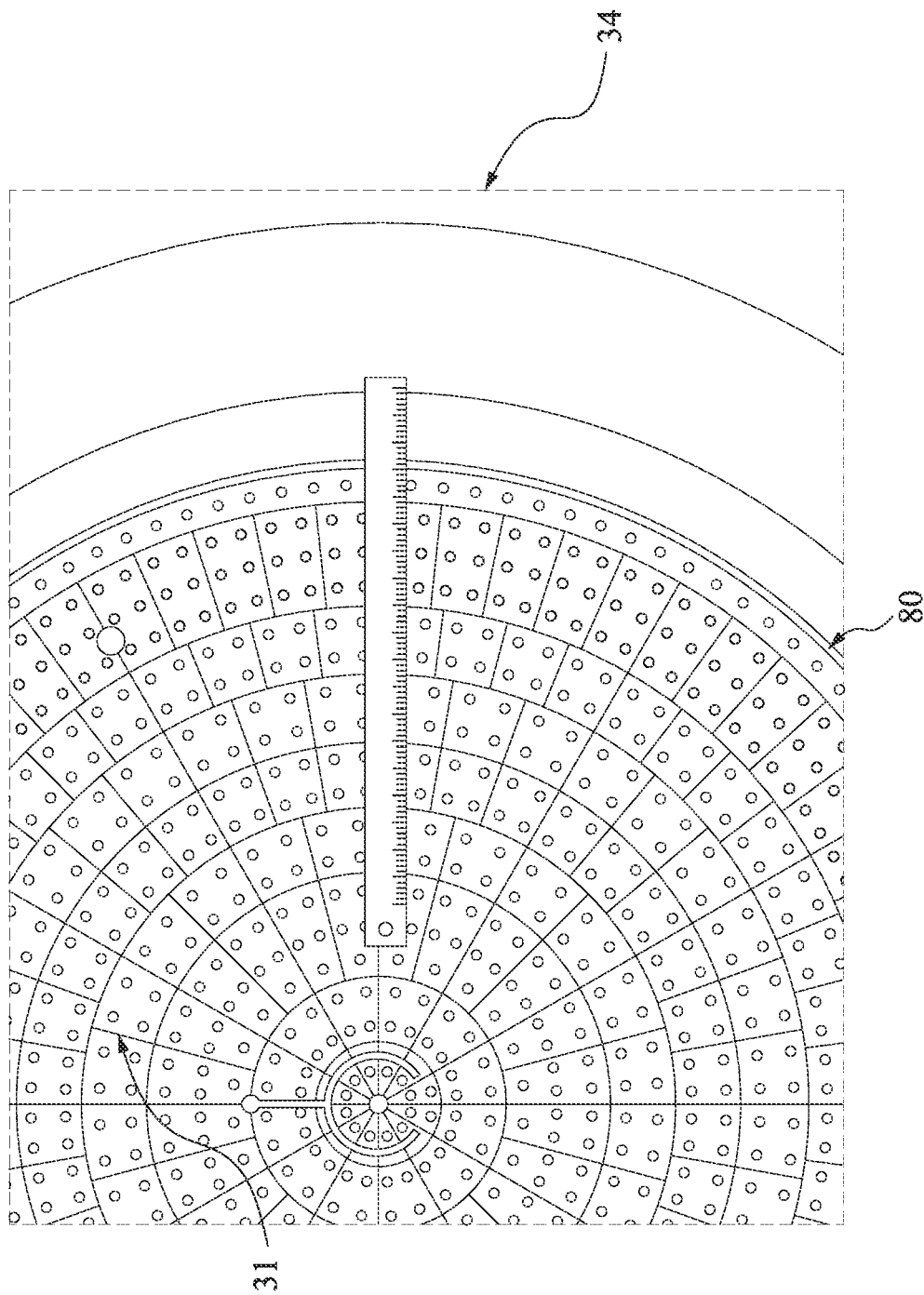

FIGS. 11A, 11B, and 12 show the deposition ring 31 and shield 34 along with the gap 80 that separates them. A visual indicator, such as a ruler as shown, or a bevel compass in various embodiments, are used to monitor and correct any offsets. Position sensors may use any of a variety of methods to determine positions and offsets. Alignment operations may be iteratively performed until the radial offsets are corrected to within a threshold tolerance as described herein.

Figure 13B:
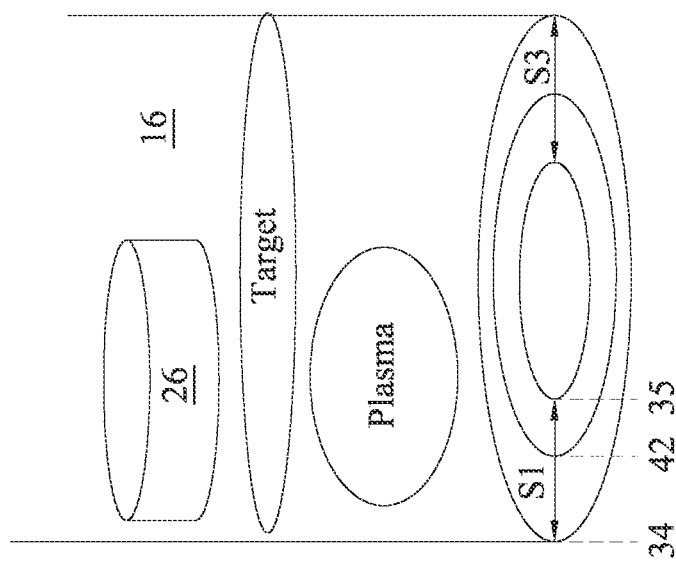
FIG. 13A and FIG. 13B show a schematic view of a chamber arrangement offset according to the disclosure.
Figure 13A:
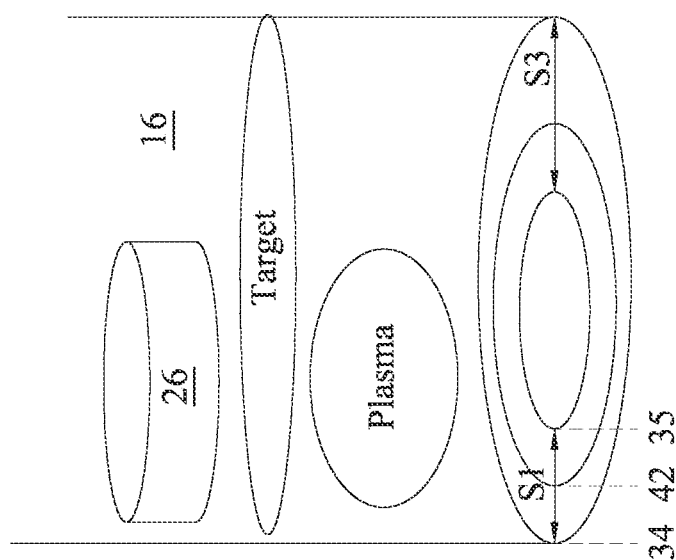

FIGS. 13A and 13B are schematic illustrations of the shield/cover ring/wafer support stage (e.g. ESC 35) alignment in perspective view according to various embodiments of the disclosure. In FIG. 13A, an offset alignment between the shield 34 and the cover ring 42 is illustrated that is unstable, namely where the offset distance |S1-S3| is greater than about 0.3 mm. In FIG. 13B, a proper alignment is illustrated where the distances S1 and S3 are maintained such that the offset distance |S1-S3|<=0.3 mm according to embodiments of the present disclosure.

Figure 14:
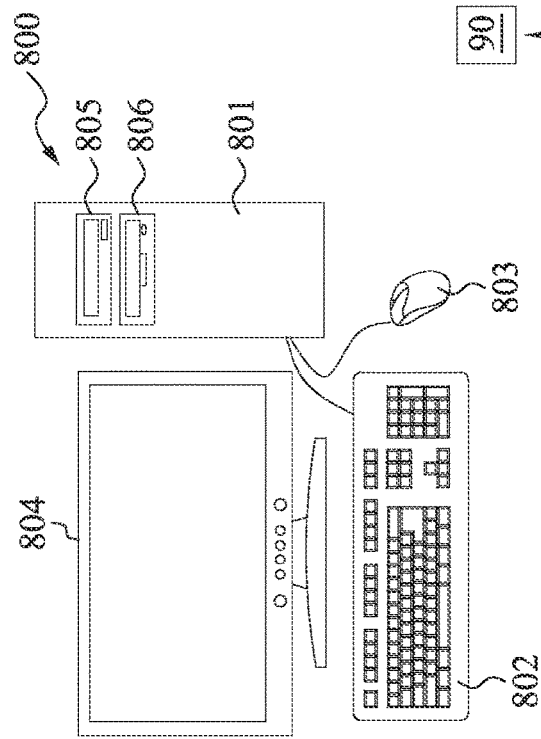
FIG. 14 and FIG. 15 show a controller according to the disclosure.
Figure 15:
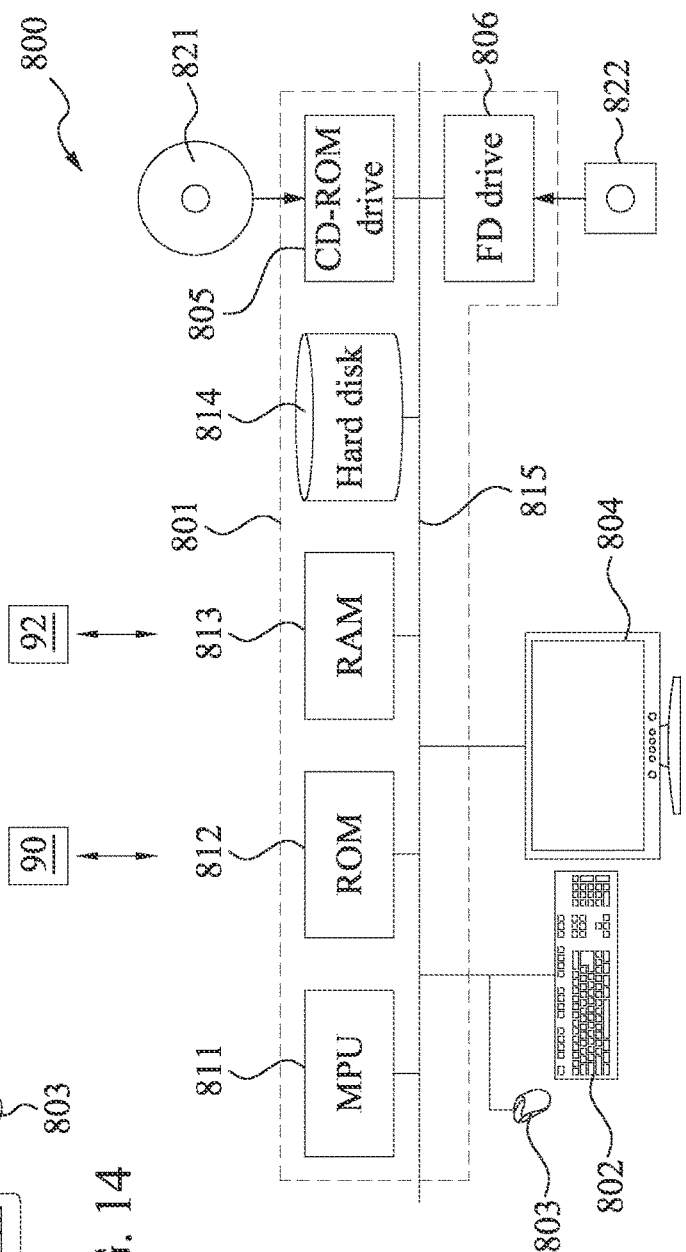

FIGS. 14 and 15 illustrate an FCD controller and the like for controlling the apparatus in accordance with some embodiments of the present disclosure. FIG. 14 is a schematic view of a computer system 800 that controls the apparatus of FIG. 1. In some embodiments, the computer system 800 is programmed to: determine the relative position of the shield 34, cover ring 42, and the wafer support stage 20; determine whether the offset in alignment of the shield 34, cover ring 42, and wafer support stage 20 is within a tolerance range; and adjust the position of the shield 34, cover ring 42, or the wafer support stage 20 when the offset in alignment is not within a tolerance range. All of or a part of the processes, method and/or operations of the foregoing embodiments are realized using computer hardware and special purpose computer programs executed thereon. In FIG. 14, the computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 15 is a diagram showing an internal configuration of the computer system 800. In FIG. 15, the computer 801 is provided with, in addition to the optical disk drive 805 and the magnetic disk drive 806, one or more processors 811, such as a micro-processor unit (MPU); a ROM 812 in which a program such as a boot up program is stored; a random access memory (RAM) 813 that is connected to the processors 811 and in which a command of an application program is temporarily stored and a temporary electronic storage area is provided; a hard disk 814 in which an application program, an operating system program, and data are stored; and a data communication bus 815 that connects the processors 811, the ROM 812, and the like. Note that the computer 801 may include a network card (not shown) for providing a connection to a computer network such as a local area network (LAN), wide area network (WAN) or any other useful computer network for communicating data used by the computing system 800.

The program for causing the computer system 800 to execute the process for controlling the apparatus of FIGS. 1-2 and/or to execute the process for the method of manufacturing a semiconductor device according to the embodiments disclosed herein are stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer system 801 and stored in the hard disk 814. At the time of execution, the program is loaded into the RAM 813. The program may be loaded from the optical disk 821 or the magnetic disk 822, or directly from a network. The program may include an FDC as described previously, which, among other functions provides an out of current range alarm when an ACT current threshold is exceeded. The current value in such conditions is about 0.145 amps (A) or higher, when the impedance of chamber is not uniform. The stored programs do not necessarily have to include, for example, an operating system (OS) or a third party program to cause the computer 801 to execute the methods disclosed herein. The program may only include a command portion to call an appropriate function (module) in a controlled mode and obtain desired results in some embodiments. In various embodiments described herein, the computer 801 is in communication with one or more position sensors 90 that determine a relative position of the shield 34, cover ring 42 and wafer support stage 20, and determine an offset in the positions thereof. In various embodiments, the computer 800 is also in operative communication with a position adjustment device 92 or mechanism that changes the position of one or more of the shield 34, the cover ring 42, the deposition ring 31 or the wafer support stage 20 so that any measured offsets there-between that are greater than a threshold value or outside a range as proscribed herein are corrected by use of the position adjustment mechanism 92.

In some embodiments, the program performs the following steps during a processing operation on a wafer or workpiece in a chamber 10, and before or during the performing a processing operation. The program determines the relative position of the shield 34, cover ring 42, or the wafer support stage 20; determines whether the offset in alignment of the shield 34, cover ring 42, or wafer support stage 20 is within a tolerance range using appropriate sensor devices (not shown); and adjusts the position of the shield 34, cover ring 42, or the wafer support stage 20 when the offset in alignment is not within the prescribed tolerance range.

In some embodiments, the program performs the following operations: determining the relative position of a shield 34, cover ring 42, or a wafer support stage 20 in a processing chamber 10; determining whether an offset in alignment of the shield 34, cover ring 42, or wafer support stage 20 is within a prescribed tolerance range; and adjusting the position of the shield 34, cover ring 42, or the wafer support stage 20 when the offset in alignment is not within a tolerance range. In some embodiments, the shield 34 and cover ring 42 are aligned so that the offset in radial alignment of the shield 34 and cover ring 42 is less than 0.3 mm.

Turning to FIG. 16, therein is depicted an exemplary process 900 in conjunction with the embodiments of the chamber 10 described above. At operation 902, a processing operation is performed on a workpiece disposed on a wafer support stage 20 in a chamber 10. At operation 904, a shield 34 is disposed over the workpiece. At operation 906, a cover ring 42 is disposed over the shield 34 such that an opening in the shield 34 is aligned with an opening in the cover ring 42 in order to expose the wafer support stage 20. Then at operation 908, the shield 34 and the cover ring 42 are aligned such that an offset in a radial alignment of the opening in the shield 34 and the opening in the cover ring 42 is less than an offset threshold value that could generate an auto-capacitive current alarm. In various embodiments, the offset in radial alignment is 0-0.3 mm (i.e., |S1-S3|<0.3 mm; |S2-S4|<0.3 mm; or |S1-S3| and |S2-S4|<0.3 mm at the same time). After, the process 900, a workpiece may be manufactured into a semiconductor device with a reduced chance of film or thickness abnormalities. In some embodiments, the operations described above (900-908) are performed by the controller 800.

Turning to FIG. 17, therein is depicted an exemplary process 950 conjunction with the embodiments of the chamber 10 described above. At operation 952, the relative position of a shield 34 and a cover ring 42 disposed over a wafer support stage 20 within a processing chamber 10 is determined. In some embodiments, position sensors 90 are used to determine the relative positions. At operation 954, it is determined whether any offset in the relative position of the shield 34 and cover ring 42 is within a tolerance range. In some embodiments, the tolerance range is 0-0.3 mm (i.e., |S1-S3|<0.3 mm; |S2-S4|<0.3 mm; or |S1-S3| and |S2-S4|<0.3 mm at the same time). At operation 956, the position of at least one of the shield 34 and the cover ring 42 is adjusted when the offset is not within the tolerance range so that the offset of the shield 34 and the cover ring 42 are within the tolerance range. In some embodiments, the position adjustment mechanism 92 is used to adjust the position of at least one of the shield 34 and the cover ring. In various embodiments, the position adjustment mechanism 92 is used to adjust the position of at least one of the wafer support stage 20 and the deposition ring 31 as well. In some embodiments, the operations 952-956 are performed by the controller 800.

In various embodiments, a wafer manufacturing process includes: initiating a PVD process. If an ACT current alarm occurs (for example, where a measured output current is over 0.145A), the PVD process is halted. An alignment process is initiated to correct radial offset distances of the deposition ring 31, the shield 34 and/or the cover ring 42. Alignment testing may be performed iteratively until a proper alignment is achieved. In some embodiments, the proper alignment is achieved when the radial offset in any one or more directions is less than 0.3 mm. After alignment, the PVD process is re-commenced and continues so long as there is no subsequent ACT alarm, and/or the measured current is lower than about 0.145A or less.

In various embodiments, a process for manufacturing a semiconductor includes: moving a wafer into a chamber 10 and over a wafer stage 20; performing alignment testing by using a position sensor to measure radial offset distances (such as S1-S3 or S2-S4 as disclosed herein), determining whether the radial offset distance is within a threshold value, and if so, commencing a semiconductor manufacturing process, such as PVD or etching.

The benefits provided by this disclosure includes preventing ACT alarms that arise during the semiconductor manufacturing process due to misalignment of the shield, cover ring and deposition ring. Additional benefits include a more uniform sputter deposition on the substrate, improved control of the thickness variation in the sputter deposited layers, and a resulting increased yield of semiconductor devices.

An embodiment of the disclosure is an apparatus including a chamber 10 and a wafer support stage 20 inside the chamber 10 for supporting a wafer. A shield 34 is disposed inside the chamber 10 disposed over the wafer support stage 20, wherein the shield 34 has an opening exposing the wafer support stage 20. A cover ring 42 is disposed over the shield 34, wherein the cover ring 42 has an opening that exposes the wafer support stage 20. The shield 34 and cover ring 42 are aligned so that an offset in radial alignment of the shield 34 and cover ring 42 is no more than a predetermined value or within a prescribed range, such as 0-0.3 mm. In an embodiment, the chamber 10 includes a position sensor 90 is configured to determine whether the shield 34 and cover ring 42 are aligned by measuring a distance between an outer periphery of the shield and an edge of the second opening. A signal from the position sensor 90 triggers an alarm corresponding to the apparatus when the radial offset is greater than the established value. A position adjustment device 92 for adjusting/centering the cover ring 42 or wafer support stage 20 is provided. In an embodiment, the cover ring 42 includes one or more alignment marks. In an embodiment, the chamber 10 is a vacuum chamber. In an embodiment, the apparatus includes an adjustment mechanism 92 for re-aligning the shield 34 and the cover ring 42 based on the radial offset determined by the position sensor 90. In an embodiment, the chamber 10 is a material deposition apparatus or an etching apparatus. In an embodiment, the chamber 10 is a physical vapor deposition apparatus. In an embodiment, the chamber 10 includes a sputtering target 16 disposed over the wafer support stage. In an embodiment, the apparatus includes sensors to sense the relative position of the cover ring 42, shield 34, and wafer support stage 20. In an embodiment, the apparatus includes a controller 800, wherein the controller is programmed to: determine the relative position of the shield 34, cover ring 42, and/or the wafer support stage 20; determine whether the offset in alignment of the shield 34, cover ring 42, and wafer support stage 20 is within a tolerance range; and adjust the position of at least one of the shield 34, cover ring 42, or the wafer support stage 20 when the offset in alignment is not within the tolerance range. In an embodiment, the apparatus includes a deposition ring 31 disposed between the cover ring 42 and the shield 34 within the chamber.

Another embodiment of the disclosure is a method of manufacturing a semiconductor device, including performing a processing operation on workpiece in a chamber 10, wherein the workpiece is disposed on a wafer support stage 20 in a chamber 10. A shield 34 is disposed above and surrounding the wafer support stage 20 and a supported wafer, and a cover ring 42 is disposed over the shield 34. An opening in the shield 34 and an opening in the cover ring 42 exposes the wafer support stage 20, and the shield 34 and cover ring 42 are aligned so that an offset in radial alignment of the shield and cover ring over is less than an offset threshold value, such as about 0.3 mm. In an embodiment, the relative position of the shield 34, cover ring 42, and/or the wafer support stage 20 is measured and it is determined whether the offset in alignment of the shield 34, cover ring 42, and wafer support stage 20 is within a tolerance range, such as 0-0.3 mm. The position of the shield 34, cover ring 42, or the wafer support stage 20 is adjusted when the offset in alignment is not within the tolerance range. In an embodiment, the processing operation is an etching operation. In an embodiment, the processing operation is a material deposition operation. In an embodiment, the processing operation is a physical vapor deposition operation. In an embodiment, the chamber includes a mechanism for adjusting/centering the cover ring 42 or the wafer support stage 20. In an embodiment, the cover ring 42 includes one or more alignment marks. In an embodiment, the chamber 10 is a vacuum chamber. In an embodiment, the chamber 10 includes one or more position sensors to sense the relative position of the cover ring 42, shield 34, and wafer support stage 20.

Another embodiment of the disclosure is a method, including determining the relative position of a shield 34, and a cover ring 42 disposed over a wafer support stage 20 in a processing chamber 10; determining whether an offset in alignment of the shield 34, cover ring 42, or wafer support stage 20 is within a tolerance range; and adjusting the position of the shield 34, cover ring 42, or the wafer support stage 20 when the offset in alignment is not within the tolerance range. The shield 34 and cover ring 42 are aligned so that the offset in radial alignment of the shield 34 and cover ring 42 is less than 0.3 mm. In an embodiment, the method includes etching a workpiece disposed on the wafer support stage 20. In an embodiment, the tolerance range is 0-0.3 mm. In an embodiment, the method includes depositing a material on a workpiece disposed on the wafer support stage 20. In an embodiment, the depositing a material is a physical vapor deposition operation. In an embodiment, the workpiece is a wafer. In an embodiment, the chamber 10 is a vacuum chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a chamber;
   a wafer support stage inside the chamber for supporting a wafer;
   a shield disposed over the wafer support stage, the shield having a first opening exposing at least a portion of the wafer support stage;
   a cover ring disposed over the shield, the cover ring having a second opening exposing the portion of the wafer support stage;
   a position sensor for determining whether the shield and the cover ring are aligned such that a radial offset of the cover ring with respect to the shield is less than an established value, wherein the established value is between 0 millimeters (mm) and 0.3 mm, and a signal from the position sensor triggers an alarm when the radial offset is greater than the established value;
   a position adjustment mechanism; and
   a controller programmed to:
   determine the radial offset using the position sensor;
   compare the radial offset to the established value stored in an electronic memory; and
   instruct the position adjustment mechanism to adjust a position of at least one of the shield and the cover ring when the radial offset is greater than the established value.

2. The apparatus of claim 1, wherein the position sensor is configured to determine whether the shield and the cover ring are aligned by measuring a distance between an outer periphery of the shield and an edge of the second opening.

3. The apparatus of claim 1, wherein the controller is further programmed to instruct the position adjustment mechanism to re-align the shield and the cover ring based on the radial offset determined by the position sensor.

4. The apparatus of claim 1, where the apparatus is at least one of a material deposition apparatus and an etching apparatus.

5. The apparatus of claim 1, where the apparatus is a physical vapor deposition apparatus.

6. The apparatus of claim 1, further comprising a deposition ring disposed between the cover ring and the wafer support stage within the chamber.

7. The apparatus of claim 6, wherein the position sensor is configured to further determine whether the deposition ring and at least one of the shield and the cover ring are aligned such that the radial offset is less than the established value.

8. A deposition apparatus, comprising:
   a vacuum chamber;
   an electrostatic chuck disposed inside the vacuum chamber;
   a shield having a first opening exposing a portion of the electrostatic chuck disposed over the electrostatic chuck;
   a cover ring having a second opening exposing the portion of the electrostatic chuck disposed over the shield;

a position sensor; and a controller programmed to:

control the position sensor to determine relative positions of the shield with respect to the cover ring, of the cover ring with respect to the electrostatic chuck, and of the shield with respect to the electrostatic chuck;

determine whether offsets in alignment of the shield with respect to the cover ring, of the cover ring with respect to the electrostatic chuck, and of the shield with respect to the electrostatic chuck are within a tolerance range, wherein the tolerance range is between 0 millimeters (mm) and 0.3 mm; and adjust a position of the shield, cover ring, or the electrostatic chuck when the offsets in alignment of the shield with respect to the cover ring, of the cover ring with respect to the electrostatic chuck, and of the shield with respect to the electrostatic chuck are not within the tolerance range.

9. The deposition apparatus of claim 8, wherein the position sensor is configured to determine whether the shield and the cover ring are aligned by measuring a distance between an outer periphery of the shield and an edge of the second opening.

10. The deposition apparatus of claim 9, further comprising a deposition ring disposed between the cover ring and the electrostatic chuck within the vacuum chamber.

11. The deposition apparatus of claim 10, wherein the position sensor is further configured to determine whether the deposition ring and at least one of the shield and the cover ring are aligned such that the offsets are less than an established value.

12. The deposition apparatus of claim 11, wherein the position sensor is further configured to generate a signal to trigger an alarm when the offsets are greater than the established value.

13. The deposition apparatus of claim 8, further comprising an adjustment mechanism controlled by the controller for re-aligning the shield and the cover ring based on the offsets determined by the position sensor.

14. The deposition apparatus of claim 8, wherein the deposition apparatus is a physical vapor deposition apparatus.

15. A deposition apparatus, comprising:

a vacuum chamber;

a wafer support stage disposed inside the vacuum chamber;

a shield having a first opening exposing a portion of an electrostatic chuck disposed over the wafer support stage;

a cover ring having a second opening exposing the portion of the electrostatic chuck disposed over the shield;

a position sensor;

a position adjustment mechanism; and a controller programmed to:

determine an offset in a relative position of the cover ring with respect to the shield using the position sensor;

determine whether the offset is within a tolerance range, wherein the tolerance range is between 0 millimeters (mm) and 0.3 mm; and control the position adjustment mechanism to correct a position of at least one of the shield and the cover ring when the offset is outside the tolerance range.

16. The deposition apparatus of claim 15, wherein the position sensor is configured to determine whether the shield and the cover ring are aligned by measuring a distance between an outer periphery of the shield and an edge of the second opening.

17. The deposition apparatus of claim 16, further comprising a deposition ring disposed between the cover ring and the wafer support stage within the vacuum chamber.

18. The deposition apparatus of claim 17, wherein the position sensor is further configured to determine whether the deposition ring and at least one of the shield and the cover ring are aligned such that the offset is less than an established value.

19. The deposition apparatus of claim 18, wherein the position sensor is further configured to generate a signal to trigger an alarm when the offset is greater than the established value.

20. The deposition apparatus of claim 15, wherein the deposition apparatus is a physical vapor deposition apparatus.

* * * * *